(12) United States Patent
Shim et al.

(10) Patent No.: US 8,643,037 B2
(45) Date of Patent: Feb. 4, 2014

(54) NITRIDE SEMICONDUCTOR LIGHT EMITTING DEVICE

(75) Inventors: Hyun Wook Shim, Gyeonggi-do (KR); Suk Ho Yoon, Seoul (KR); Tan Sakong, Gyeonggi-do (KR); Je Won Kim, Seoul (KR); Ki Sung Kim, Gyeonggi-do (KR)

(73) Assignee: Samsung Electronics Co., Ltd., Suwon-Si (KR)

(*) Notice: Subject to any disclaimer, the term of this patent is extended or adjusted under 35 U.S.C. 154(b) by 0 days.

(21) Appl. No.: 13/441,562

(22) Filed: Apr. 6, 2012

(65) Prior Publication Data

US 2012/0261687 A1   Oct. 18, 2012

(30) Foreign Application Priority Data

Apr. 13, 2011   (KR) .................. 10-2011-0034401

(51) Int. Cl.
*H01L 33/32* (2010.01)

(52) U.S. Cl.
USPC .......... 257/97; 257/94; 257/E33.027; 257/13; 257/E33.049

(58) Field of Classification Search
USPC ............... 257/94, 97, 79, E33.001–E33.077
See application file for complete search history.

(56) References Cited

U.S. PATENT DOCUMENTS

| 5,959,307 A | 9/1999 | Nakamura et al. |
| 6,635,904 B2 | 10/2003 | Goetz et al. |
| 7,312,474 B2 | 12/2007 | Emerson et al. |
| 8,294,164 B2 * | 10/2012 | Oh et al. .................. 257/97 |
| 2005/0285125 A1 * | 12/2005 | Kim et al. ................. 257/94 |

FOREIGN PATENT DOCUMENTS

KR   10-0665364 B1   12/2006

* cited by examiner

*Primary Examiner* — Marc Armand
*Assistant Examiner* — Quinton Brasfield
(74) *Attorney, Agent, or Firm* — McDermott Will & Emery LLP

(57) ABSTRACT

There is provided a nitride semiconductor light emitting device including: n-type and p-type nitride semiconductor layers; an active layer disposed between the n-type and p-type nitride semiconductor layers; and an electron injection layer disposed between the n-type nitride semiconductor layer and the active layer. The electron injection layer has a multilayer structure, in which three or more layers having different energy band gaps are stacked, and the multilayer structure is repetitively stacked at least twice. At least one layer among the three or more layers has a reduced energy band gap in individual multilayer structures in a direction toward the active layer, and the layer having the lowest energy band gap has an increased thickness in individual multilayer structures in a direction toward the active layer.

20 Claims, 6 Drawing Sheets

NITRIDE SEMICONDUCTOR LIGHT EMITTING DEVICE

CROSS-REFERENCE TO RELATED APPLICATIONS

This application claims the priority of Korean Patent Application No. 10-2011-0034401 filed on Apr. 13, 2011, in the Korean Intellectual Property Office, the disclosure of which is incorporated herein by reference.

BACKGROUND OF THE INVENTION

1. Field of the Invention

The present invention relates to a nitride semiconductor light emitting device.

2. Description of the Related Art

In recent years, a group III-V nitride semiconductor, such as a GaN semiconductor, has been prominent as an essential material for light emitting devices, such as light emitting diodes (LEDs), laser diodes (LDs), and the like, due to its excellent physical and chemical properties. LEDs or LDs using a group III-V nitride semiconductor material are mainly used in light emitting devices for producing light in a blue or green wavelength band. These light emitting devices are being used as light sources for various applications requiring high current and high output such as backlight units (BLUs), electronic display boards, lighting apparatuses and the like.

With the use of a nitride semiconductor light emitting device in various applications, a method of effectively injecting electrons into an active layer has become important in a high-power light emitting device having a large area. According to the related art, a super lattice layer has been stacked for the diffusion of current into the active layer and for stress relief, and an electron ejection layer has been grown for electron injection. However, such a complex stack structure may increase stress and the possibility of occurrence of defects in an interface, and defects may be propagated to the active layer, whereby light emitting efficiency and reliability of the semiconductor light emitting device may be reduced.

SUMMARY OF THE INVENTION

An aspect of the present invention provides a nitride semiconductor light emitting device being improved in current distribution due to two-dimensional electron gas (2DEG) and having an enhanced current injection effect and light emitting efficiency.

An aspect of the present invention also provides a nitride semiconductor light emitting device having an electron injection layer relieving stress from a nitride layer and reducing the possibility of occurrence of defects.

An aspect of the present invention also provides a nitride semiconductor light emitting device having superior luminance and being improved in productivity by simplifying a nitride semiconductor structure and reducing production time.

According to an aspect of the present invention, there is provided a nitride semiconductor light emitting device including: n-type and p-type nitride semiconductor layers; an active layer disposed between the n-type and p-type nitride semiconductor layers; and an electron injection layer disposed between the n-type nitride semiconductor layer and the active layer, wherein the electron injection layer has a multilayer structure, in which three or more layers having different energy band gaps are stacked, the multilayer structure is repetitively stacked at least twice, and at least one layer among the three or more layers has a reduced energy band gap in individual multilayer structures in a direction toward the active layer.

The multilayer structure may be formed of a semiconductor material having a composition expressed by $In_xAl_yGa_{1-x-y}N$, where $0 \leq x \leq 1$, $0 \leq y \leq 1$, and $0 \leq x+y \leq 1$, and the multilayer structure may have different energy band gaps with different composition ratios of Al and In.

The multilayer structure may be formed as a super lattice structure.

The multilayer structure may include a laminate of InGaN/GaN/AlGaN layers.

The multilayer structure may include a laminate of AlGaN/GaN/InGaN layers.

The multilayer structure may include a laminate of InGaN/GaN/AlGaN/GaN layers.

The multilayer structure may include a first layer, a second layer having a lower energy band gap than the first layer, and a third layer having an energy band gap between those of the first and second layers, and the first and second layers may be alternately stacked while having the third layer interposed therebetween.

At least one of the first and second layers may have a reduced energy band gap in the individual multilayer structures in the direction toward the active layer.

The third layer may include two or more layers having different energy band gaps, and the two or more layers may be stacked to be interposed between the first and second layers while allowing the energy band gaps thereof to be sequentially increased or decreased.

The multilayer structure may include a first layer, a second layer having a lower energy band gap than the first layer, and a third layer having an energy band gap between those of the first and second layers, and the multilayer structure may have the first, third and second layers sequentially stacked therein.

The multilayer structure may include a first layer, a second layer having a lower energy band gap than the first layer, and a third layer having an energy band gap between those of the first and second layers, and the multilayer structure may have the second, third and first layers sequentially stacked therein.

A layer having the lowest energy band gap among the three or more layers may have an increased thickness in the individual multilayer structures in the direction toward the active layer.

According to another aspect of the present invention, there is provided a nitride semiconductor light emitting device including: n-type and p-type nitride semiconductor layers; an active layer disposed between the n-type and p-type nitride semiconductor layers; and an electron injection layer disposed between the n-type nitride semiconductor layer and the active layer, wherein the electron injection layer has a multilayer structure, in which three or more layers having different energy band gaps are stacked, the multilayer structure is repetitively stacked at least twice, and a layer having the lowest energy band gap among the three or more layers has an increased thickness in individual multilayer structures in a direction toward the active layer.

The multilayer structure may be formed of a semiconductor material having a composition expressed by $In_xAl_yGa_{1-x-y}N$, where $0 \leq x \leq 1$, $0 \leq y \leq 1$, and $0 \leq x+y \leq 1$, and the multilayer structure may have different energy band gaps with different composition ratios of Al and In.

The multilayer structure may be formed as a super lattice structure.

The multilayer structure may include a first layer, a second layer having a lower energy band gap than the first layer, and a third layer having an energy band gap between those of the first and second layers, and the first and second layers may be alternately stacked while having the third layer interposed therebetween.

At least one of the first and second layers may have a reduced energy band gap in the individual multilayer structures in the direction toward the active layer.

The third layer may include two or more layers having different energy band gaps, and the two or more layers may be stacked to be interposed between the first and second layers while allowing the energy band gaps thereof to be sequentially increased or decreased.

The multilayer structure may include a first layer, a second layer having a lower energy band gap than the first layer, and a third layer having an energy band gap between those of the first and second layers, and the multilayer structure may have the first, third and second layers sequentially stacked therein.

The multilayer structure may include a first layer, a second layer having a lower energy band gap than the first layer, and a third layer having an energy band gap between those of the first and second layers, and the multilayer structure may have the second, third and first layers sequentially stacked therein.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE INVENTION

Figure 1:
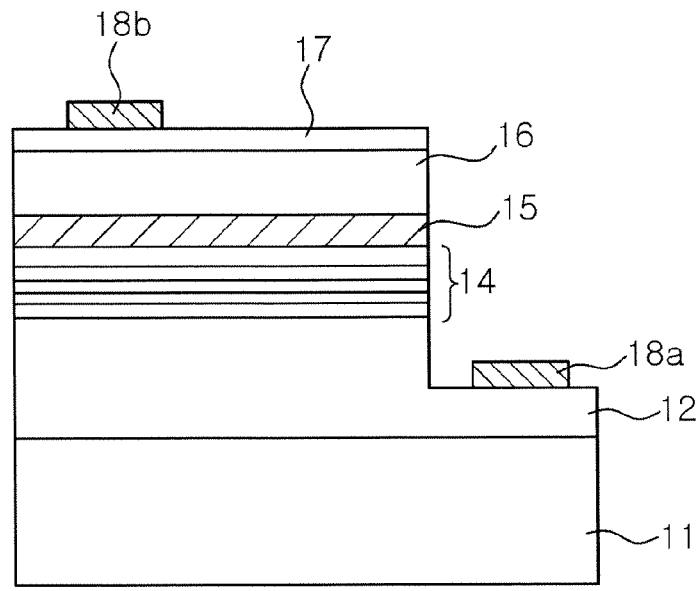
FIG. 1 is a schematic cross-sectional view illustrating a nitride semiconductor light emitting device according to a first embodiment of the present invention.

Embodiments of the present invention will now be described in detail with reference to the accompanying drawings.

The invention may, however, be embodied in many different forms and should not be construed as being limited to the embodiments set forth herein. Rather, these embodiments are provided so that this disclosure will be thorough and complete, and will fully convey the scope of the invention to those skilled in the art.

In the drawings, the shapes and dimensions of elements may be exaggerated for clarity, and the same reference numerals will be used throughout to designate the same or like elements.

Figure 2:
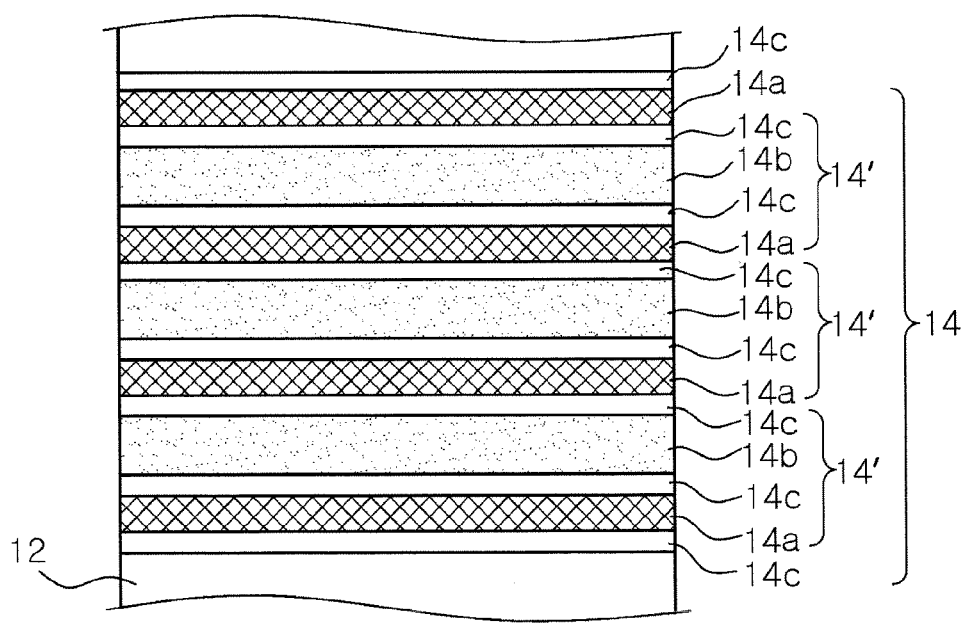
FIG. 2 is a partial cross-sectional view illustrating an electron injection layer having a multilayer structure according to the first embodiment of the present invention depicted in FIG. 1.
Figure 3:
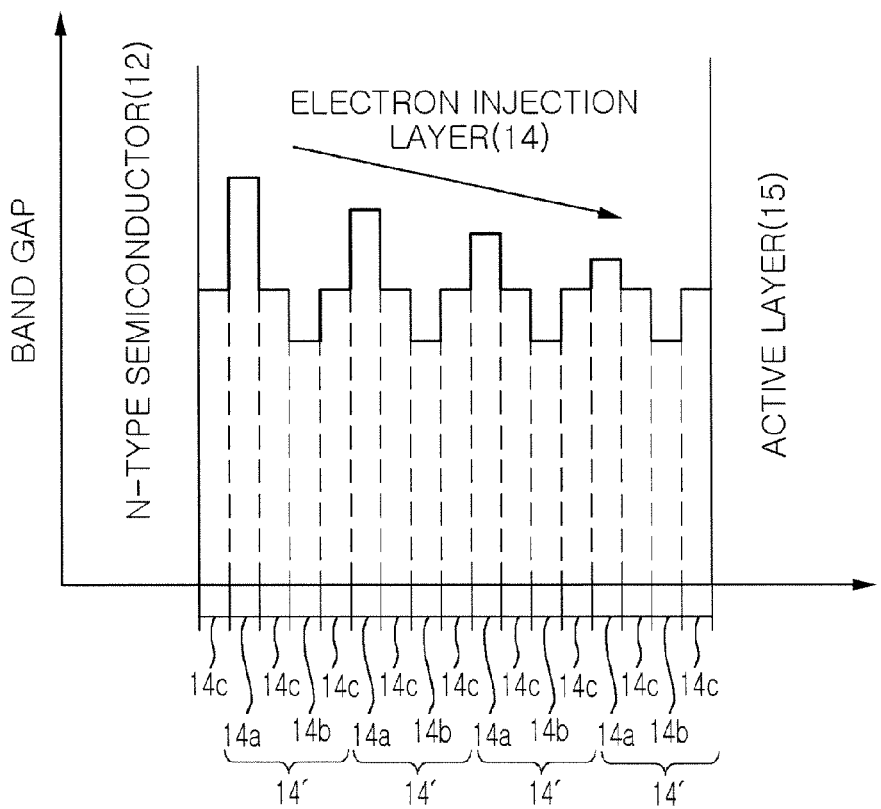
FIG. 3 is a graph illustrating an example of a band gap profile of the electron injection layer depicted in FIG. 2.

FIG. 1 is a schematic cross-sectional view illustrating a nitride semiconductor light emitting device according to a first embodiment of the present invention. FIG. 2 is a partial cross-sectional view illustrating an electron injection layer having a multilayer structure according to the first embodiment of the present invention depicted in FIG. 1. FIG. 3 is a graph illustrating an example of a band gap profile of the electron injection layer depicted in FIG. 2. With reference to FIGS. 1 through 3, a nitride semiconductor light emitting device 10 according to a first embodiment of the present invention includes n-type and p-type nitride semiconductor layers 12 and 16, an active layer 15 formed between the n-type and p-type nitride semiconductor layers 12 and 16, and an electron injection layer 14 formed between the n-type nitride semiconductor layer 12 and the active layer 15. The electron injection layer 14 may have a multilayer structure 14', in which three or more layers 14a, 14b and 14c having different energy band gaps are stacked. The multilayer structure 14' may be repetitively stacked at least twice. At least one layer among the layers constituting the multilayer structure may have a reduced energy band gap in individual multilayer structures 14', in a direction toward the active layer 15.

The n-type and p-type nitride semiconductor layers 12 and 16 may be formed of a semiconductor material having a composition expressed by $Al_xIn_yGa_{(1-x-y)}N$, where $0 \le x \le 1$, $0 \le y \le 1$, and $0 \le x+y \le 1$. For example, GaN, AlGaN, and InGaN may be used therefor. The active layer 15, disposed between the n-type and p-type nitride semiconductor layers 12 and 16, emits light having a predetermined level of energy through electron-hole recombination. The active layer 15 may have a multi-quantum well (MQW) structure, in which quantum well and quantum barrier layers are alternately stacked. The multi-quantum well structure may employ an InGaN/GaN structure, for example. The n-type and p-type nitride semiconductor layers 12 and 16 and the active layer 15 may be formed by using a known semiconductor-layer growth technique such as metal-organic chemical vapor deposition (MOCVD), molecular beam epitaxy (MBE), hybrid vapor-phase epitaxy (HVPE) or the like.

With reference to FIG. 1, the nitride semiconductor light emitting device 10 according to this embodiment may further include a substrate 11 disposed on a surface of a light emitting structure including the n-type and p-type nitride semiconductor layers 12 and 16 and the active layer 15. The substrate 11 may be formed of sapphire, SiC, $MgAl_2O_4$, MgO, $LiAlO_2$, $LiGaO_2$, GaN or the like. Sapphire is a crystal having Hexa-Rhombo R3C symmetry and has a lattice constant of 13.001 Å along a C-axis and a lattice constant of 4.758 Å along an A-axis. Orientation planes of the sapphire include a C (0001)

plane, an A (1120) plane, anR (1102) plane, and the like. Particularly, the C plane is mainly used as a substrate for nitride growth because it relatively facilitates the growth of a nitride film and is stable at a high temperature. Furthermore, a buffer layer (not shown) may be an undoped semiconductor layer formed of nitrides and the like, and serve to relieve lattice defects in the semiconductor layers grown thereon.

N-side and p-side electrodes 18a and 18b may be formed on the n-type and p-type nitride semiconductor layers 12 and 16, respectively, such that they are electrically connected to the n-type and p-type nitride semiconductor layers 12 and 16, respectively. As shown in FIG. 1, the n-side electrode 18a may be formed on the n-type nitride semiconductor layer 12, which is exposed by etching the p-type nitride semiconductor layer 16, the active layer 15, the electron injection layer 14 and a portion of the n-type nitride semiconductor layer 12, and the p-side electrode 18b may be formed on the p-type nitride semiconductor layer 16. As shown in FIG. 1, a transparent electrode 17 formed of ITO, ZnO or the like may be further provided to improve ohmic contact between the p-type nitride semiconductor layer 16 and the p-side electrode 18b. In the structure of FIG. 1, the n-side and p-side electrodes 18a and 18b are formed in the same directions, but the positions and connections thereof may be variable according to necessity. For example, in a case in which the n-side electrode 18a is formed on the n-type nitride semiconductor layer 12 exposed by the removal of the substrate 11, a current flow area may be expanded to thereby improve current distribution.

The electron injection layer 14 may be disposed between the n-type nitride semiconductor layer 12 and the active layer 15. The electron injection layer 14 may have a multilayer structure 14', in which the three or more layers 14a, 14b and 14c having different energy band gaps are stacked. The multilayer structure 14' may be repetitively stacked at least twice. At least one layer among the layers constituting the multilayer structure may have a reduced energy band gap in the individual multilayer structures 14' in a direction toward the active layer 15. With reference to FIGS. 2 and 3, the multilayer structure 14' of the electron injection layer 14 according to this embodiment may include first, second and third layers 14a, 14b and 14c having different energy band gaps. Specifically, the multilayer structure 14' includes the first layer 14a, the second layer 14b having a lower energy band gap than the first layer 14a, and the third layer 14c having an energy band gap between the energy band gaps of the first and second layers 14a and 14b. The first and second layers 14a and 14b may be alternately stacked while having the third layer 14c interposed therebetween, such that the four layers of the first layer 14a/the third layer 14c/the second layer 14b/the third layer 14c being sequentially stacked may form a single multilayer structure 14'.

The multilayer structure may be formed of a semiconductor material having a composition expressed by $In_xAl_yGa_{1-x-y}N$, where $0 \le x \le 1$, $0 \le y \le 1$, and $0 \le x+y \le 1$. The semiconductor layers constituting the multilayer structure may have different energy band gaps with different composition ratios of Al and In. Specifically, an increase in In content causes a decrease in the band gap, and an increase in Al content causes an increase in the band gap. For example, the first, second and third layers 14a, 14b and 14c are formed of AlGaN, InGaN, and GaN, respectively, such that the electron injection layer 14 may have a super lattice structure, in which the multilayer structure 14' formed of AlGaN/GaN/InGaN/GaN layers may be repetitively stacked at least twice. In the case in which the electron injection layer 14 with differing band gaps has the super lattice structure, the shielding of crystal defects may be further improved.

In the case in which the electron injection layer 14 includes the AlGaN layer, lattice constant difference between the sapphire substrate and the semiconductor layers may be reduced to thereby relieve stress, and accordingly, defect rates within the semiconductor layers may be reduced. Also, since the electron injection layer 14 has the multilayer structure 14' in which three or more layers having different band gaps are stacked, dislocation defects may be effectively suppressed, and accordingly, crystal quality of the semiconductor light emitting device may be enhanced. In particular, the InGaN layer 14b may effectively bend and stop dislocation defects when the AlGaN layer 14a and the GaN layer 14c are grown, and the GaN layer 14c may serve to relieve tensile stress from the AlGaN layer 14a having a high energy band gap and relieve compress stress from the InGaN layer 14b having a low energy band gap. Therefore, the electron injection layer 14 may serve to shield dislocation defects while relieving stress. The enhanced stress relief of the electron injection layer 14 may lead to a better crystal quality of the semiconductor layers formed on the electron injection layer 14.

Meanwhile, at least one layer among the layers constituting the multilayer structure 14' may have a reduced energy band gap in the individual multilayer structures 14' in a direction toward the active layer 15. With reference to FIG. 3, at least one layer among the first to third layers 14a, 14b and 14c constituting the multilayer structure 14', for example, the first layer 14a having the highest energy band gap, may have a reduced energy band gap in the individual multilayer structures 14' in a direction toward the active layer 15. Due to a sloped structure, in which the energy band gap of at least one layer among the layers constituting the multilayer structure 14' is reduced in the individual multilayer structures 14' in a direction toward the active layer 15, electron injection from the n-type nitride semiconductor layer 12 to the active layer 15 may be facilitated to thereby improve electron injection efficiency. Therefore, according to this embodiment, the electron injection layer 14 is interposed between the n-type nitride semiconductor layer 12 and the active layer 15, thereby improving electron injection efficiency, relieving stress, and shielding dislocation defects, and thus enhancing crystal quality.

Figure 4:
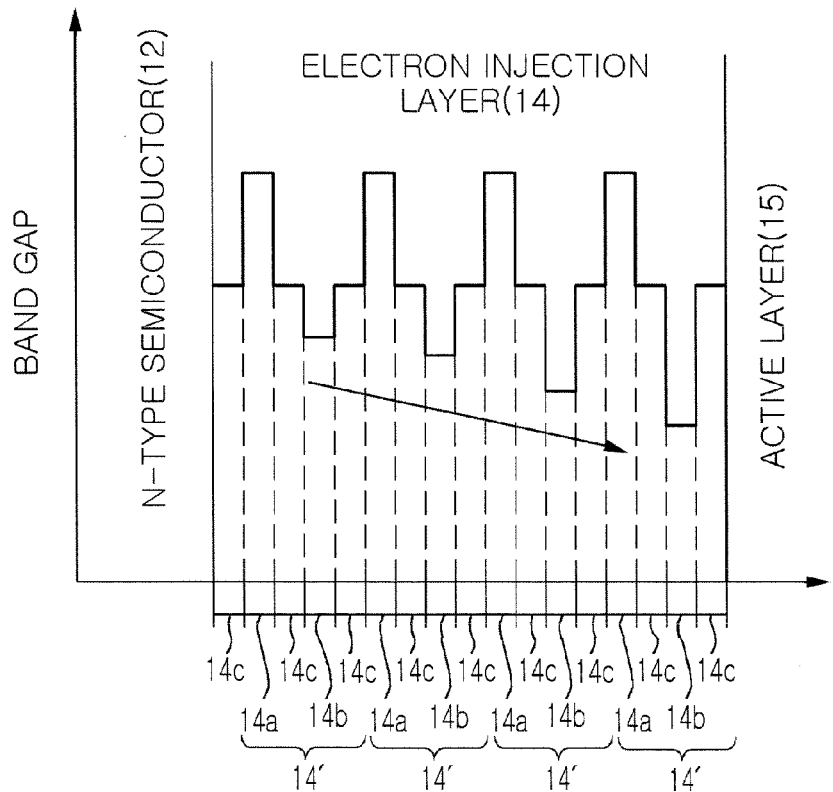
FIG. 4 is a graph illustrating another example of a band gap profile of the electron injection layer applicable to the first embodiment of the present invention.

FIG. 4 is a graph illustrating another example of a band gap profile of the electron injection layer applicable to the first embodiment of the present invention. Unlike the embodiment depicted in FIG. 3, the second layer 14b having the lowest energy band gap among the first to third layers 14a, 14b and 14c may have a reduced energy band gap in the individual multilayer structures 14' in a direction toward the active layer 15, and the energy band gaps of the first and third layers 14a and 14c may be maintained in the entirety of the electron injection layer 14. In this case, electron injection from the n-type nitride semiconductor layer 12 to the active layer 15 may be facilitated to thereby improve electron injection efficiency. Unlike the present embodiment, all the energy band gaps of the first to third layers 14a, 14b and 14c may have a sloped structure. Alternatively, the energy band gaps of two layers may have a sloped structure and the energy band gap of one layer may be consistently maintained.

Meanwhile, in the electron injection layer 14 of FIGS. 1 through 4, each multilayer structure 14' formed of the first layer 14a/the third layer 14c/the second layer 14b/the third layer 14c may be repetitively stacked at least twice. The electron injection layer 14 is not particularly limited, so long as it may have repetitively stacked multilayer structures, each of which may have a laminate of three or more layers having different energy band gaps. For example, the electron injection layer 14 may have at least two multilayer structures, each formed of three AlGaN/GaN/InGaN layers, repetitively stacked.

Figure 5:
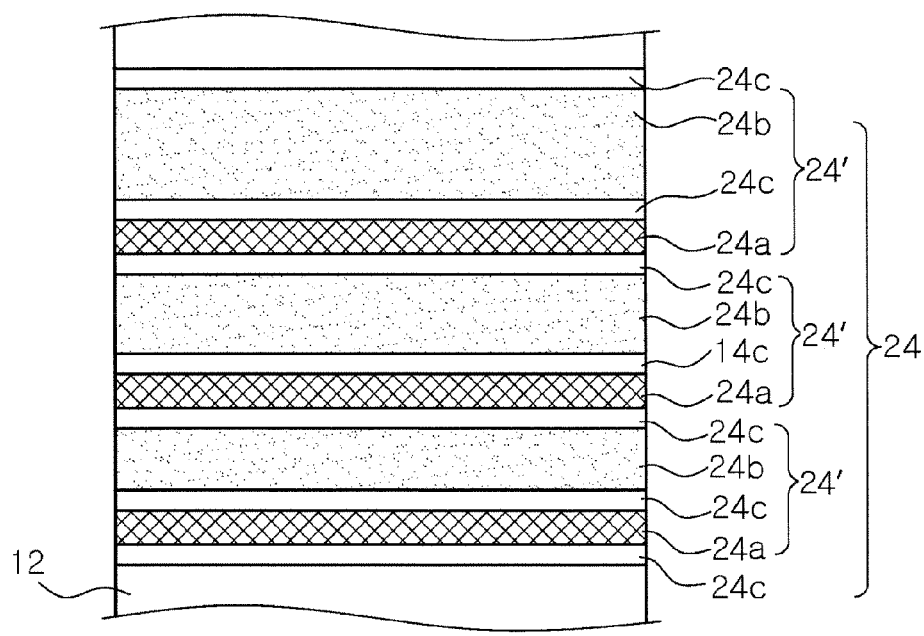
FIG. 5 is a partial cross-sectional view illustrating an electron injection layer having a multilayer structure according to a second embodiment of the present invention.
Figure 6:
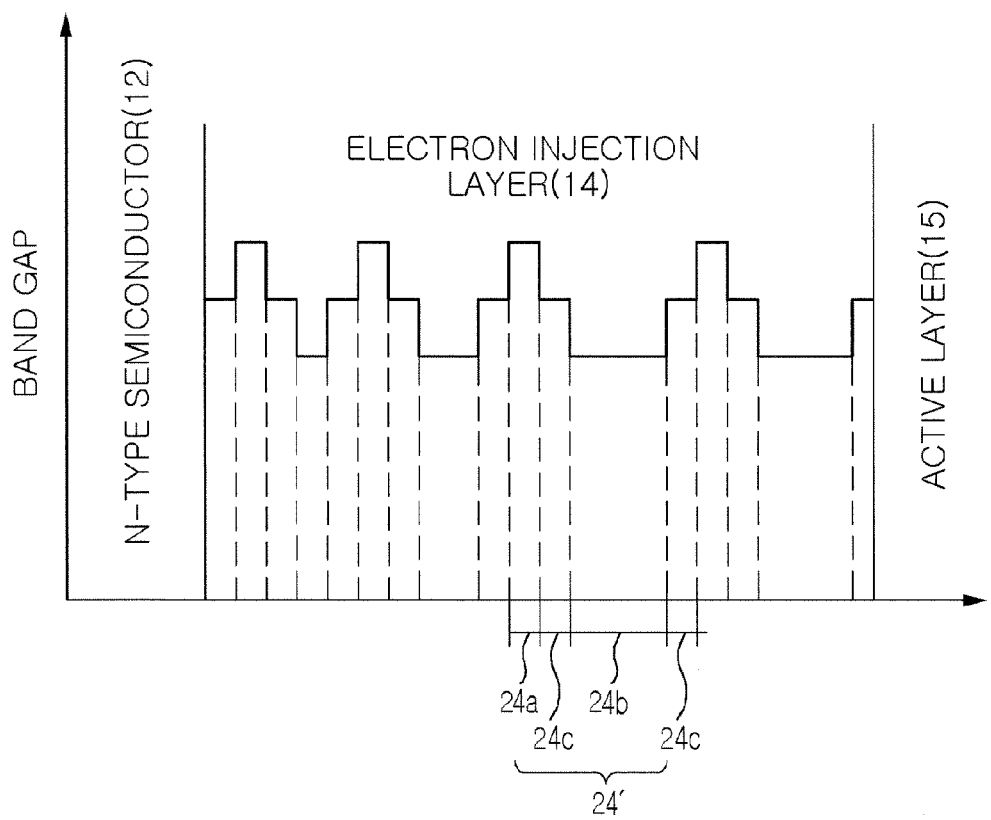
FIG. 6 is a graph illustrating an example of a band gap profile of the electron injection layer depicted in FIG. 5.

FIG. 5 is a partial cross-sectional view illustrating an electron injection layer having a multilayer structure according to a second embodiment of the present invention. FIG. 6 is a graph illustrating an example of a band gap profile of the electron injection layer depicted in FIG. 5. In the present embodiment, the same configuration as that of the first embodiment may be employed, except for the configuration of the electron injection layer. An electron injection layer 24 according to the present embodiment is interposed between the n-type nitride semiconductor layer 12 and the active layer 15. The electron injection layer 24 may have a multilayer structure 24', in which three or more layers 24a, 24b and 24c having different energy band gaps are stacked. The multilayer structure 24' may be repetitively stacked at least twice. The layer 24b having the lowest energy band gap among the layers 24a, 24b and 24c may have an increased thickness in individual multilayer structures 24' in a direction toward the active layer 15.

With reference to FIGS. 5 and 6, each multilayer structure 24' of the electron injection layer 24 has first, second and third layers 24a, 24b and 24c having different energy band gaps. Specifically, the multilayer structure 24' includes the first layer 24a, the second layer 24b having a lower energy band gap than the first layer 24a, and the third layer 24c having an energy band gap between the energy band gaps of the first and second layers 24a and 24b. The first and second layers 24a and 24b may be alternately stacked while having the third layer 24c interposed therebetween, such that the four layers of the first layer 24a/the third layer 24c/the second layer 24b/the third layer 24c being sequentially stacked may form a single multilayer structure 24'. Here, the second layer 24b having the lowest energy band gap among the layers may have an increased thickness in the individual multilayer structures 24' in a direction toward the active layer 15. Accordingly, more electrons may be distributed in a region adjacent to the active layer 15, whereby current distribution and current injection efficiency may be improved.

For example, the first, second and third layers 24a, 24b and 24c are formed of AlGaN, InGaN, and GaN, respectively, such that the electron injection layer 24 may have a super lattice structure, in which the multilayer structure 24' formed of AlGaN/GaN/InGaN/GaN layers may be repetitively stacked at least twice. In the case in which the electron injection layer 14 with differing band gaps has the super lattice structure, the shielding of crystal defects may be further improved. In the present embodiment, the electron injection layer 24 has the multilayer structures 24' having different energy band gaps, thereby shielding crystal defects in the semiconductor layers. In addition, the second layer 24b having the lowest energy band gap has an increased thickness in the individual multilayer structures 24' in a direction toward the active layer 15, thereby improving electron injection efficiency from the n-type nitride semiconductor layer 12 to the active layer 15.

In the electron injection layer 24 according to the present embodiment, each multilayer structure 24' formed of the first layer 24a/the third layer 24c/the second layer 24b/the third layer 24c may be repetitively stacked at least twice. However, the electron injection layer 24 is not particularly limited, so long as it may have repetitively stacked multilayer structures, each of which may have a laminate of three or more layers having different energy band gaps. For example, the electron injection layer may have at least two multilayer structures, each formed of three AlGaN/GaN/InGaN layers, repetitively stacked, while the InGaN layer having the lowest energy band gap may have an increased thickness in the individual multilayer structures in a direction toward the active layer.

Figure 7:
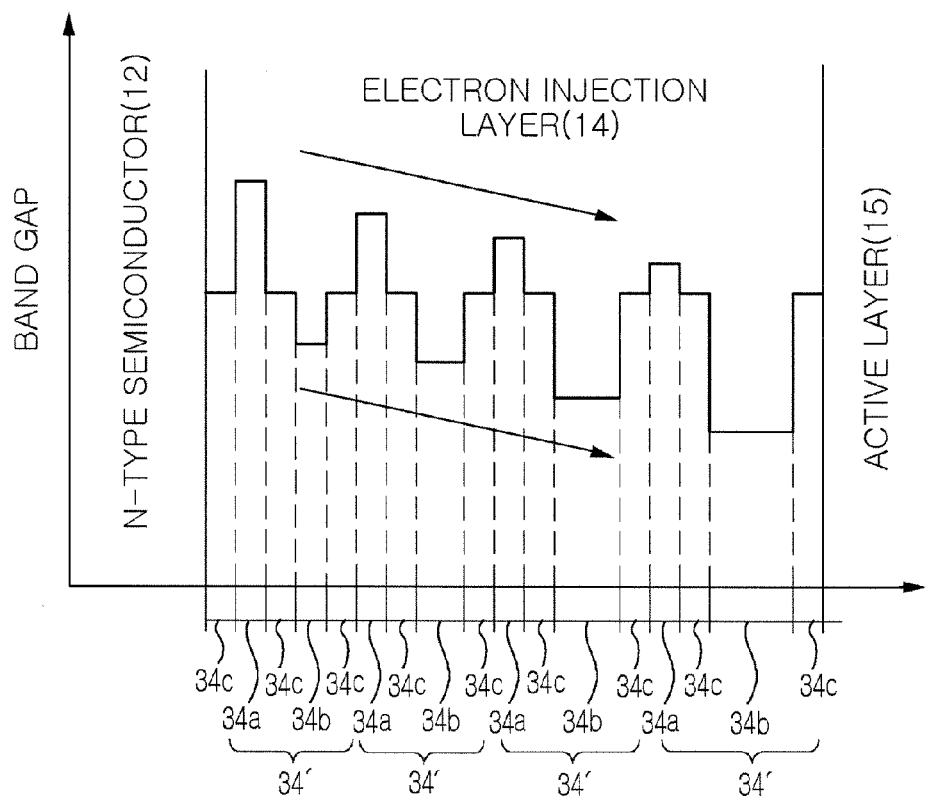
FIG. 7 is a graph illustrating another example of a band gap profile of the electron injection layer according to the second embodiment of the present invention.

FIG. 7 is a graph illustrating another example of a band gap profile of the electron injection layer according to the second embodiment of the present invention. Unlike the embodiment depicted in FIG. 6, at least one layer in multilayer structures 34' of an electron injection layer 34 according to this embodiment may have a reduced energy band gap in the individual multilayer structures 34' in a direction toward the active layer 15. That is, due to a sloped structure in which the energy band gap of the at least one layer is reduced in the individual multilayer structures 34' in a direction toward the active layer 15 while the thickness of the layer having the lowest energy band gap is increased in the individual multilayer structures 34' in a direction toward the active layer 15, electron injection efficiency from the n-type nitride semiconductor layer 12 to the active layer 15 may be significantly improved.

With reference to FIG. 7, as described in the electron injection layer 24 of FIG. 6, each multilayer structure 34' of the electron injection layer 34 according to this embodiment has first, second and third layers 34a, 34b and 34c having different energy band gaps. Specifically, the four layers of the first layer 34a/the third layer 34c/the second layer 34b/the third layer 34c being sequentially stacked may form a single multilayer structure 34'. Here, the first and second layers 34a and 34b have reduced energy band gaps in the individual multilayer structures 34' in a direction toward the active layer 15. Such a sloped structure may lead to enhanced current injection efficiency.

Figure 8:
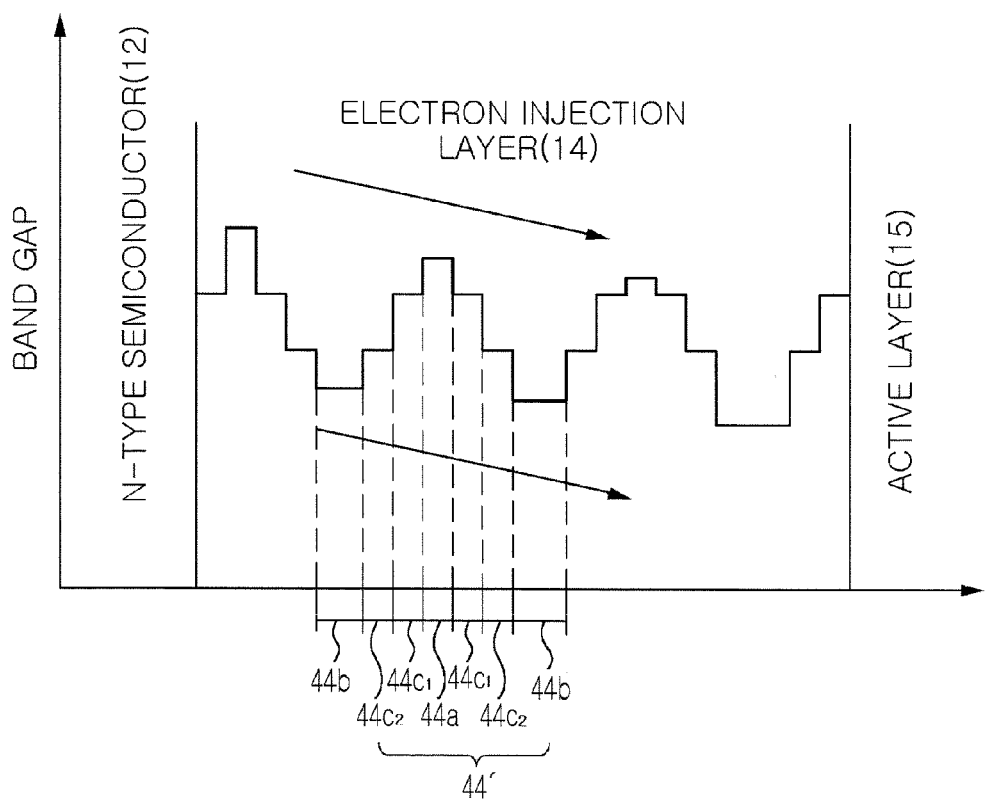
FIG. 8 is a graph illustrating another example of a band gap profile of the electron injection layer according to the second embodiment of the present invention.

FIG. 8 is a graph illustrating another example of a band gap profile of the electron injection layer according to the second embodiment of the present invention. In the present embodiment, a third layer 44c includes two or more layers 44c1 and 44c2 having different energy band gaps. With reference to FIG. 8, a multilayer structure 44' has a first layer 44a having the highest energy band gap, a second layer 44b having a lower energy band gap than the first layer 44a, and the third layer 44c divided into two layers 44c1 and 44c2 having respective energy band gaps between the energy band gaps of the first and second layers 44a and 44b. While being interposed between the first and second layers 44a and 44b, the two third layers 44c1 and 44c2 may be stacked to have sequentially increased or decreased energy band gaps. The band gaps of the respective layers may be controlled by adjusting a composition ratio of Al and In.

In the present embodiment, the first layer 44a having the highest energy band gap and the second layer 44b having the lowest energy band gap may have reduced energy band gaps in individual multilayer structures 44' in a direction toward the active layer 15, and the third layers 44c1 and 44c2 may have consistent energy band gaps between the energy band gaps of the first and second layers in the individual multilayer structures. In addition, the second layer 44b having the lowest energy band gap may have an increased thickness in the individual multilayer structures in a direction toward the active layer 15. Alternatively, the third layers 44c1 and 44c2 may have reduced energy band gaps in the individual multilayer structures in a direction toward the active layer 15. In particular, the energy band gaps are sequentially increased or decreased in a stacking direction such that the stress caused by differing band gaps may be effectively relieved. That is, the layers 44c1 and the 44c2, interposed between the second layer 44b having the lowest energy band gap and the first layer 44a having the highest energy band gap, have sequentially increased or decreased energy band gaps, such that they may serve to effectively relieve the stress.

Figure 9:
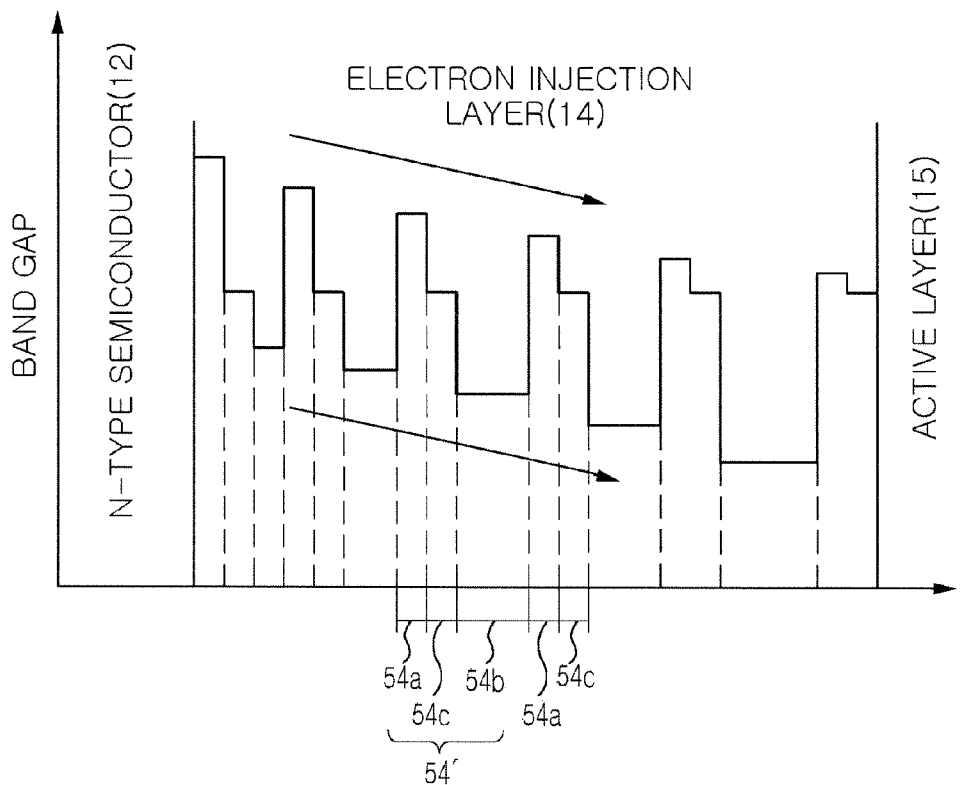
FIG. 9 is a graph illustrating another example of a band gap profile of the electron injection layer according to the second embodiment of the present invention.

FIG. 9 is a graph illustrating another example of a band gap profile of the electron injection layer according to the second embodiment of the present invention. An electron injection layer 54 according to this embodiment is formed between the n-type nitride semiconductor layer 12 and the active layer 15, and has a multilayer structures 54', in which three layers 54a, 54b and 54c having different energy band gaps are stacked. The multilayer structure 54' may be repetitively stacked at least twice. The layer 54b having the lowest energy band gap among the layers constituting the multilayer structure has an increased thickness in individual multilayer structures in a direction toward the active layer 15. Specifically, the multilayer structure 54' includes a first layer 54a, a second layer 54b having a lower energy band gap than the first layer 54a, and a third layer 54c having an energy band gap between the energy band gaps of the first and second layers 54a and 54b. The first and second layers 54a and 54b have the third layer 54c interposed therebetween, such that the three layers of the first layer 54a/the third layer 54c/the second layer 54b sequentially stacked may form a single multilayer structure 54'.

Within the electron injection layer 54 of the present embodiment, a two-dimensional electron gas (2DEG) layer (not shown) may be formed in an interface between the first layer 54a formed of AlGaN and the third layer 54c formed of GaN due to energy band discontinuity therebetween. In this case, high carrier mobility is secured in a region in which the 2DEG layer is formed, whereby current distribution may be significantly improved.

Figure 10:
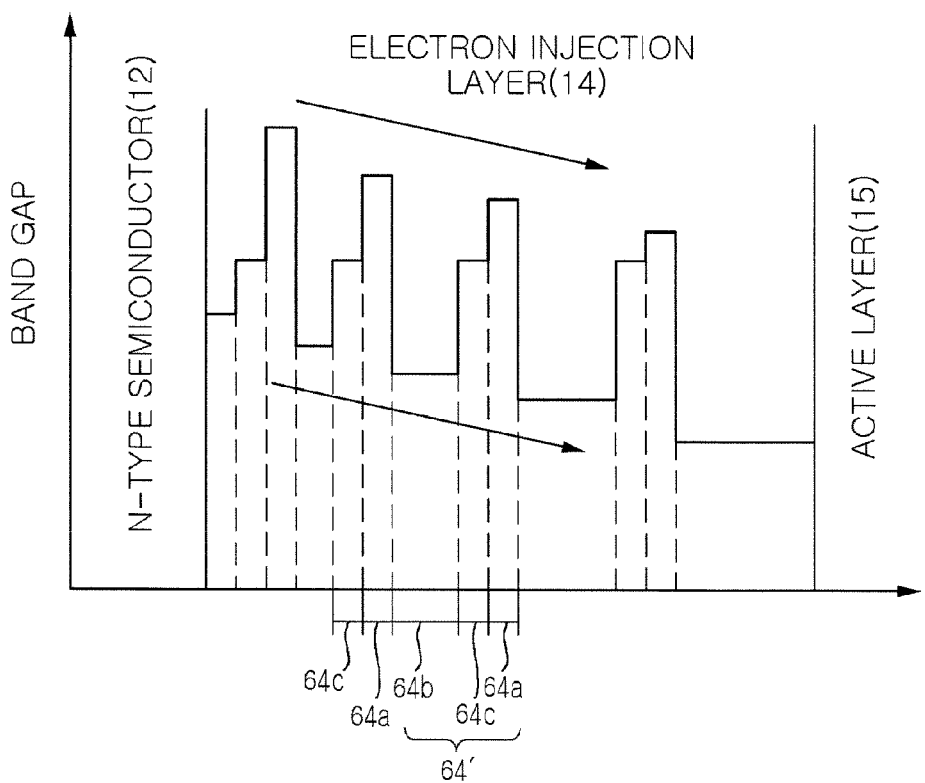
FIG. 10 is a graph illustrating another example of a band gap profile of the electron injection layer according to the second embodiment of the present invention.

FIG. 10 is a graph illustrating another example of a band gap profile of the electron injection layer according to the second embodiment of the present invention. With reference to FIG. 10, an electron injection layer 64 may have a multilayer structure 64' of a second layer 64b/a third layer 64c/a first layer 64a. The electron injection layer 64 may have a super lattice structure. The first and second 64a and 64b may have reduced energy band gaps in individual multilayer structures in a direction toward the active layer 15 and the third layer 64c may have a consistent energy band gap and an increased thickness in individual multilayer structures in a direction toward the active layer 15. Within the electron injection layer 64 of the present embodiment, a 2DEG layer (not shown) may be formed in an interface between the first layer 64a formed of AlGaN and the second layer 64b formed of InGaN due to energy band discontinuity therebetween. In this case, high carrier mobility is secured in a region in which the 2DEG layer is formed, whereby current distribution may be significantly improved.

Figure 11:
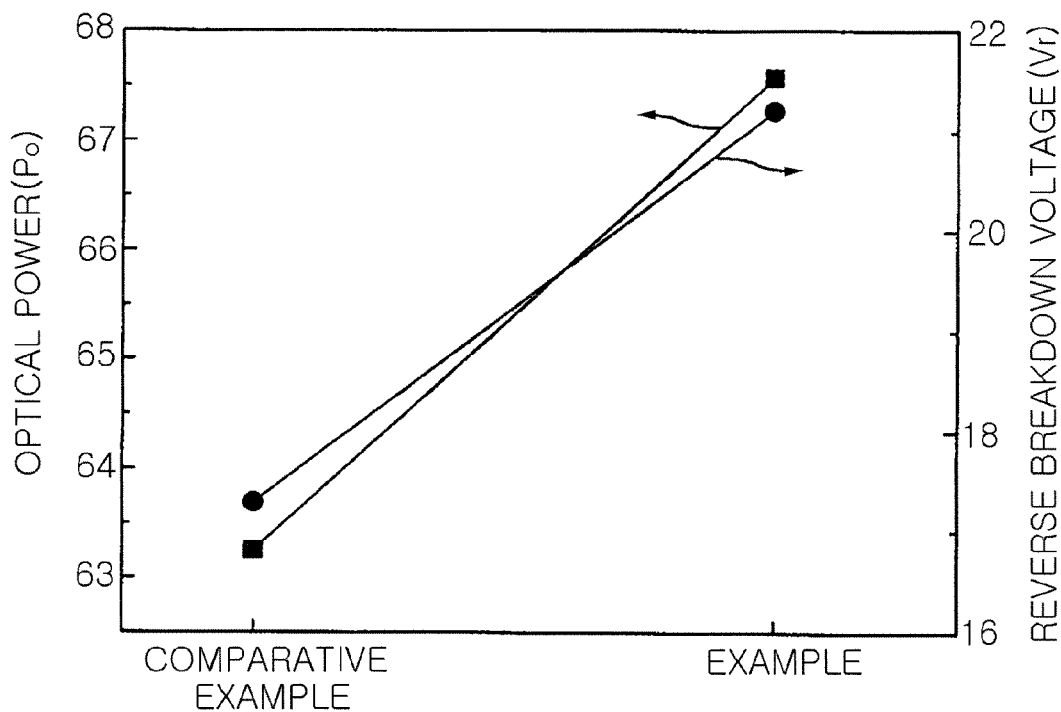
FIG. 11 is a comparison graph illustrating optical and electrical characteristics between a nitride semiconductor light emitting device according to the second embodiment of the present invention depicted in FIG. 7 and a GaN-based light emitting diode (LED) device according to the related art.
Figure 12:
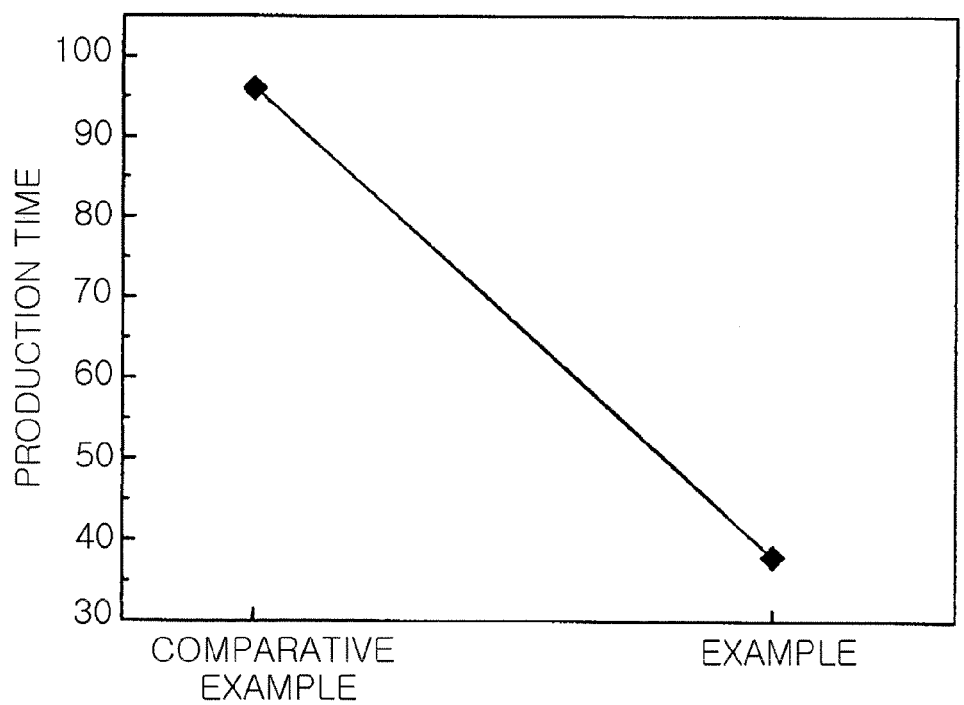
FIG. 12 is a comparison graph illustrating production time between a nitride semiconductor light emitting device according to the second embodiment of the present invention depicted in FIG. 7 and a GaN-based light emitting diode (LED) device according to the related art.

FIG. 11 is a comparison graph illustrating optical and electrical characteristics between the nitride semiconductor light emitting device according to the second embodiment of the present invention depicted in FIG. 7 and a GaN-based light emitting diode (LED) device according to the related art. FIG. 12 is a comparison graph illustrating production time between the nitride semiconductor light emitting device according to the second embodiment of the present invention depicted in FIG. 7 and a GaN-based light emitting diode (LED) device according to the related art.

In order to verify improvements in luminance and electrical characteristics, tests for evaluating the luminance and electrical characteristics were carried out with respect to a GaN-based LED device including the electron injection layer 34 having the multilayer structure depicted in FIG. 7 and a GaN-based LED device according to the related art without an electron injection layer. The electron injection layer 34 of the LED device used in the tests includes the multilayer structures, each of which has AlGaN/GaN/InGaN/GaN layers stacked therein. The AlGaN layer 34a and the InGaN layer 34b have reduced energy band gaps in individual multilayer structures in a direction toward the active layer, and the GaN layer 34c has a consistent energy band gap. In addition, the InGaN layer 34b having the lowest energy band gap has an increased thickness in the individual multilayer structures in a direction toward the active layer.

As a result of the tests for evaluating the luminance and electrical characteristics, the LED device including the electron injection layer 34 exhibited an improvement in terms of reverse breakdown voltage Vr as compared with the related art LED device. In addition, the LED device including the electron injection layer 34 exhibited an improvement in terms of optical power Po as compared with the related art LED device. (see FIG. 11) The improvement in the optical power through the electron injection layer 34 means an improvement in luminance of the LED device, resulting from a reduction in crystal defects and from current spreading in the semiconductor crystal. In addition, the improvement in the reverse breakdown voltage through the electron injection layer 34 means an improvement in reliability of the LED device, resulting from a reduction in crystal defects in the semiconductor crystal. As such, according to the embodiment of the present invention, crystal quality is improved by the insertion of the electron injection layer 34, whereby the luminance and reliability of the LED device may be enhanced.

In order to verify an improvement in productivity, production time may be measured with respect to the GaN-based LED device including the electron injection layer 34 having the multilayer structure depicted in FIG. 7 and the related art GaN-based LED device without an electron injection layer. The electron injection layer 34 of the LED device includes the repetitively stacked multilayer structures, each of which has AlGaN/GaN/InGaN/GaN layers stacked therein. The AlGaN layer 34a and the InGaN layer 34b have reduced energy band gaps in individual multilayer structures in a direction toward the active layer, and the GaN layer 34c has a consistent energy band gap. In addition, the InGaN layer 34b having the lowest energy band gap has an increased thickness in the individual multilayer structures in a direction toward the active layer. As a result of the measurements of production time, a production time of the LED device including the electron injection layer 34 was reduced by 40% as compared with a production time of the related art LED device. (see FIG. 12)

As set forth above, according to embodiments of the invention, a nitride semiconductor light emitting device provides improved current distribution and current injection effect.

In addition, the nitride semiconductor light emitting device is significantly improved in light emitting efficiency and reliability by reducing the possibility of occurrence of defects due to stress relief in semiconductor layers.

While the present invention has been shown and described in connection with the embodiments, it will be apparent to those skilled in the art that modifications and variations can be made without departing from the spirit and scope of the invention as defined by the appended claims.

What is claimed is:

1. A nitride semiconductor light emitting device comprising:
    n-type and p-type nitride semiconductor layers;
    an active layer disposed between the n-type and p-type nitride semiconductor layers; and
    an electron injection layer disposed between the n-type nitride semiconductor layer and the active layer,
    wherein the electron injection layer has a multilayer structure comprising two or more layer stacks disposed on top of each other, in which each layer stack includes three or more sequential layers having different energy band gaps, and one layer among the three or more sequential layers in one layer stack has a lower energy band gap as compared to a corresponding layer among the three or more sequential layers in another layer stack of the electron injection layer.

2. The nitride semiconductor light emitting device of claim 1, wherein the multilayer structure is formed of a semiconductor material having a composition expressed by $In_x Al_y Ga_{1-x-y} N$, where $0 \leq x \leq 1$, $0 \leq y \leq 1$, and $0 \leq x+y \leq 1$, and
the multilayer structure has layers having different energy band gaps with different composition ratios of Al and In.

3. The nitride semiconductor light emitting device of claim 1, wherein the multilayer structure is formed as a super lattice structure.

4. The nitride semiconductor light emitting device of claim 1, wherein the multilayer structure comprises a laminate of InGaN/GaN/AlGaN layers.

5. The nitride semiconductor light emitting device of claim 1, wherein the multilayer structure comprises a laminate of AlGaN/GaN/InGaN layers.

6. The nitride semiconductor light emitting device of claim 1, wherein the multilayer structure comprises a laminate of InGaN/GaN/AlGaN/GaN layers.

7. The nitride semiconductor light emitting device of claim 1, wherein each layer stack of the multilayer structure includes a first layer, a second layer having a lower energy band gap than the first layer, and a third layer having an energy band gap between those of the first and second layers, and
each layer stack of the multilayer structure has the first, third and second layers sequentially stacked therein.

8. The nitride semiconductor light emitting device of claim 1, wherein each layer stack of the multilayer structure includes a first layer, a second layer having a lower energy band gap than the first layer, and a third layer having an energy band gap between those of the first and second layers, and
each layer stack of the multilayer structure has the second, third and first layers sequentially stacked therein.

9. The nitride semiconductor light emitting device of claim 1, wherein a layer having the lowest energy band gap among the three or more layers in a particular layer stack has a larger thickness as compared to a corresponding layer among the three or more layers in another layer stack that is located further from the active layer than the particular layer stack in the electron injection layer.

10. The nitride semiconductor light emitting device of claim 1, wherein the one layer stack including the one layer having the lower energy band gap is located closer to the active layer than the other layer stack of the electron injection layer.

11. The nitride semiconductor light emitting device of claim 1, wherein each layer stack of the multilayer structure includes a first layer, a second layer having a lower energy band gap than the first layer, and a third layer having an energy band gap between those of the first and second layers, and
the first and second layers of each layer stack are alternately stacked while having the third layer interposed therebetween.

12. The nitride semiconductor light emitting device of claim 11, wherein at least one of the first and second layers of each layer stack has a reduced energy band gap in the individual multilayer structures in the direction toward the active layer.

13. The nitride semiconductor light emitting device of claim 11, wherein the third layer of each layer stack includes two or more layers having different energy band gaps, and
the two or more layers are stacked to be interposed between the first and second layers while allowing the energy band gaps thereof to be sequentially increased or decreased.

14. A nitride semiconductor light emitting device comprising:
n-type and p-type nitride semiconductor layers;
an active layer disposed between the n-type and p-type nitride semiconductor layers; and
an electron injection layer disposed between the n-type nitride semiconductor layer and the active layer,
wherein the electron injection layer has a multilayer structure comprising two or more layer stacks disposed on top of each other, in which each layer stack includes three or more sequential layers having different energy band gaps, and
a layer having the lowest energy band gap among the three or more sequential layers in one layer stack has a larger thickness as compared to a corresponding layer among the three or more sequential layers in another layer stack of the electron injection layer.

15. The nitride semiconductor light emitting device of claim 14, wherein each layer stack of the multilayer structure includes a first layer, a second layer having a lower energy band gap than the first layer, and a third layer having an energy band gap between those of the first and second layers, and
each layer stack of the multilayer structure has the first, third and second layers sequentially stacked therein.

16. The nitride semiconductor light emitting device of claim 14, wherein each layer stack of the multilayer structure includes a first layer, a second layer having a lower energy band gap than the first layer, and a third layer having an energy band gap between those of the first and second layers, and
each layer stack of the multilayer structure has the second, third and first layers sequentially stacked therein.

17. The nitride semiconductor light emitting device of claim 14, wherein the one layer stack including the one layer having the larger thickness is located closer to the active layer than the other layer stack.

18. The nitride semiconductor light emitting device of claim 14, wherein each layer stack of the multilayer structure includes a first layer, a second layer having a lower energy band gap than the first layer, and a third layer having an energy band gap between those of the first and second layers, and
the first and second layers of each layer stack are alternately stacked while having the third layer interposed therebetween.

19. The nitride semiconductor light emitting device of claim 18, wherein at least one of the first and second layers of each layer stack has a reduced energy band gap in the individual multilayer structures in the direction toward the active layer.

20. The nitride semiconductor light emitting device of claim 18, wherein the third layer of each layer stack includes two or more layers having different energy band gaps, and
the two or more layers are stacked to be interposed between the first and second layers while allowing the energy band gaps thereof to be sequentially increased or decreased.

* * * * *